United States Patent [19]
Linliu et al.

[11] Patent Number: 5,688,713
[45] Date of Patent: Nov. 18, 1997

[54] METHOD OF MANUFACTURING A DRAM CELL HAVING A DOUBLE-CROWN CAPACITOR USING POLYSILICON AND NITRIDE SPACERS

[75] Inventors: Kung Linliu; Erik Syangywan Jeng; Tzu-Shih Yen, all of Taipei, Taiwan

[73] Assignee: Vanguard International Semiconductor Corporation, Hsinchu, Taiwan

[21] Appl. No.: 703,254

[22] Filed: Aug. 26, 1996

[51] Int. Cl.$^6$ .................................. H01L 21/8242
[52] U.S. Cl. .................. 437/60; 437/191; 437/919
[58] Field of Search .................... 437/46, 47, 60, 437/191, 193, 200, 919

[56] References Cited

U.S. PATENT DOCUMENTS

| | | | |
|---|---|---|---|
| 5,278,091 | 1/1994 | Fazan et al. | 437/60 |
| 5,399,518 | 3/1995 | Sim et al. | 437/52 |
| 5,438,013 | 8/1995 | Kim et al. | 437/60 |
| 5,443,993 | 8/1995 | Park et al. | 437/60 |
| 5,491,103 | 2/1996 | Ahn et al. | 437/52 |
| 5,498,562 | 3/1996 | Dennison et al. | 437/919 |
| 5,545,582 | 8/1996 | Roh | 437/919 |

*Primary Examiner*—Chandra Chaudhari
*Attorney, Agent, or Firm*—George O. Saile; Stephen B. Ackerman

[57] ABSTRACT

A method for manufacturing an array of double-crown-shaped storage capacitors with increased capacitance on a dynamic random access memory (DRAM) device has been achieved. The invention utilizes a polysilicon and silicon nitride spacer to form the double-crown capacitors while forming concurrently bit lines and node contacts for the bottom electrodes of the storage capacitors. A silicon nitride layer and a silicon nitride spacer are used to insulate the bit lines from the capacitors formed thereon. The polysilicon sidewall spacer is used to pattern a very narrow vertical insulating structure on which is formed the polysilicon double crown by depositing another polysilicon layer which is etched back. The vertical insulating structures are removed by selective etching leaving a free-standing bottom electrode having a double-crown-shaped structure. An inter-electrode dielectric layer having a high dielectric constant, and a final polysilicon layer are deposited to complete the storage capacitors for the DRAM.

20 Claims, 8 Drawing Sheets

METHOD OF MANUFACTURING A DRAM CELL HAVING A DOUBLE-CROWN CAPACITOR USING POLYSILICON AND NITRIDE SPACERS

BACKGROUND OF THE INVENTION (1) Field of the Invention

This invention relates to an integrated circuit semiconductor device, and more particularly to a method for fabricating dynamic random access memory (DRAM) cells with double-crown capacitors for increased capacitance.

(2) Description of the Prior Art

A dramatic increase in the integrated circuit density on the semiconductor substrate and the semiconductor chips formed therefrom has occurred in recent years. This dramatic increase in circuit density is a result of down-sizing the individual devices which results in an increase in device packing density on the chip. These reductions in size of the devices was achieved by advances in semiconductor technology innovations, such as high-resolution photolithography and directional (anisotropic) plasma etching. Future requirements for increased circuit density will put greater demands on the semiconductor processing technologies and also on the device electrical requirements.

The DRAM chip used in the electronics industry for storing information is one of the circuit types experiencing this demand for increased density. The circuit on the DRAM chip consists in part of an array of individual DRAM storage cells that store binary data (bits) as electrical charge on a storage capacitor. This information is stored or retrieved from the storage capacitor by means of a pass transistor on each memory cell, and by address and read/write circuits on the periphery of the DRAM chip. The pass transistor is usually a field effect transistor (FET) and the single capacitor in each cell is either formed in the semiconductor substrate as a trench capacitor or built over the FET in the cell area as a stacked capacitor. By the year 1998 the number of memory cells (bits) on a DRAM chip is expected to reach about 256 million and by the year 2001 the bit count on the DRAM chip is expected to be about 1 Gigabits.

With this rapid increase in the number of memory cells on the DRAM chip, and the need to maintain a reasonable chip size with improved circuit performance, the area of the individual cells must be further reduced in size. As the cell size decreases it becomes more difficult to fabricate a stacked capacitor with sufficient capacitance to store the necessary charge to provide an acceptable signal-to-noise level for the read circuit (sense amplifiers) to detect. The reduced charge also necessitates increasing the refresh cycle frequency that periodically restores the charge on these volatile storage cells. Since the capacitor area is limited to the cell size in order to accommodate the multitude of cells on the DRAM chip, it is necessary to explore alternative methods for increasing the capacitance without increasing the lateral area that the capacitor occupies on the substrate surface.

Numerous three-dimensional stacked storage capacitor structures have been reported in the literature for increasing the capacitance. For example, Sim et al. in U.S. Pat. No. 5,399,518, teach a method of forming a storage capacitor having a double-cylindrical wall. The method involves etching bit line contacts forming the bit lines first which are insulated, and then etching a second array of contact openings for the capacitor node contacts. The storage capacitor electrode is then formed in a thick polysilicon layer that is deposited in the node contact openings and elsewhere over the substrate. An outer etching mask for forming an outer cylinder and an inner etching mask for forming an inner cylinder are formed on the polysilicon layer. The inner and outer etching masks are then used to form a double-cylinder electrode. Sim et al. form the electrode from a single conducting layer. Park et al. in U.S. Pat. No. 5,443,993 also describe a method for forming a DRAM cell in which the bit lines are formed first, and then a second array of contact openings is etched for the node contacts. Park then forms a double-cylinder electrode structure using an insulating spacer on a patterned conducting layer, and after recessing the patterned conducting layer deposits and anisotropically etches back a second conducting layer to form the cylindrical electrodes. The insulating sidewall is removed to form the freestanding cylindrical electrode. Ahn et al. (U.S. Pat. No. 5,491,103) also teach a method for making a double-crown shaped capacitor in which is required a low temperature oxide (LTO) to be deposited on a patterned photoresist layer to form sidewalls so as not to distort the resist image. After removing the photoresist, a conducting layer is deposited and etched back to form the crown-shaped electrodes. Another method is taught by Kim et al. (U.S. Pat. No. 5,438,013) in which a controlled undercut (lateral etching) is used to form the double-sidewall mask used to etch and thereby pattern the double-cylindrical electrode in a conducting layer. However, the spacing and size of the capacitors depend on the controlled undercut. Ahn and Kim also form the bit line contacts in a separate masking and etching step from the capacitor node contact openings and therefore also require an additional masking step.

Therefore there is still a strong need in the semiconductor industry to provide a reliable method for making DRAM storage capacitors with increased capacitance while circumventing several of the problems mentioned above.

SUMMARY OF THE INVENTION

It is therefore a principal object of the present invention to provide an array of dynamic random access memory (DRAM) cells having a double-crown capacitor with increased capacitance.

It is another object of the present invention to fabricate these double-crown capacitors in which the bit line contacts and the capacitor node contacts are etched simultaneously, and filled with a polysilicon layer having a silicide layer on top which is then patterned to form the bit lines and node contacts concurrently.

The method for fabricating dynamic random access memory cells having double-crown storage capacitors formed by the method of this invention is described. The method also allows for the simultaneous etching of the bit line contacts and node contacts for the storage capacitors. The node contacts and bit lines are then formed from a single second polycide layer.

The method begins by providing an array of device areas on a semiconductor substrate, such as on a single-crystal silicon substrate doped with a P-type conductive dopant (e.g., boron). The device areas are provided by forming a relatively thick field oxide surrounding and electrically isolating each device area. One method of forming the field oxide areas is by protecting the device areas from oxidation using a silicon nitride ($Si_3N_4$) layer, and thermally oxidizing exposed field oxide areas on the silicon substrate. This method is commonly referred to as the LOCal Oxidation of Silicon (LOCOS) in the semiconductor industry. After removing the silicon nitride layer, a thin gate oxide is formed on the device areas, and a first polycide layer is deposited having a first insulating layer deposited thereon. The first insulating layer and first polycide layer are patterned to form gate electrodes for field effect transistors (FETs) on the device areas. The patterned polycide layer also serves as the word lines over the field oxide regions. Lightly doped drain (LDD) areas adjacent to the gate electrodes are formed by ion implantation, and insulating sidewall spacers are formed next by depositing a conformal second insulating layer and anisotropically etching back the second insulating layer. Source/drain areas are formed next by ion implanting an $N^+$ type dopant adjacent to the sidewall spacers. This completes the array of FETs used to form the array of pass transistors in the DRAM cells.

Now continuing with the method of this invention, the next series of steps form the bit lines formed from a second polycide layer and concurrently form the polysilicon node contacts for the capacitors. The method involves depositing a third insulating layer which is planarized, and then a first polysilicon layer is deposited on the third insulating layer. The first polysilicon layer is patterned by anisotropic plasma etching. And further, the etching is continued to partially recess the third insulating layer over device areas adjacent to the gate electrodes. A conformal second polysilicon layer is deposited and is anisotropically etched back to form polysilicon spacers on the sidewalls of the first recessed areas. The patterned first polysilicon layer and polysilicon spacers serve as an etch mask to anisotropically etch the third insulating layer in the first recessed areas to form concurrently the bit line contact openings and the capacitor node contact openings. A third polysilicon layer is deposited to completely fill both types of contact openings. A silicide layer such as tungsten silicide ($WSi_2$) is deposited on the third polysilicon layer. A silicon nitride ($Si_3N_4$) layer is deposited next on the silicide layer, and the multilayer comprised of the silicon nitride layer, the silicide layer, and the third polysilicon layer is patterned to form the bit lines while leaving portions of the third polysilicon layer in the node contact openings for the capacitors. Silicon nitride spacers are formed on the sidewalls of the bit lines by depositing and etching back a second $Si_3N_4$ layer.

Proceeding with the method of this invention, the double-crown shaped capacitors are formed next for the array of DRAM cells. The method continues by depositing a conformal fourth polysilicon layer over the silicon nitride-insulated bit lines and also extending over and into the node contact openings making electrical contact to the third polysilicon portions. A relatively thick fourth insulating layer is deposited on the fourth polysilicon layer and is planarized using one of several methods such as thermal reflow or chemical/mechanical polishing. Using a photoresist mask and anisotropic etching, the planar fourth insulating layer is patterned by partially etching into the fourth insulating layer leaving unetched portions over the node contacts, which results in second recessed areas elsewhere on the substrate. The perimeter around the unetched areas defines the region where the double-crown shaped capacitors will be formed. A conformal fifth polysilicon layer is deposited and anisotropically etched back to form polysilicon spacers on the sidewalls in the second recessed areas. Now, using the polysilicon spacers as an etch mask, the fourth insulating layer, such as silicon oxide ($SiO_2$), is further anisotropically etched to the fourth polysilicon layer in an etchant gas having an etch selectivity of oxide-to-polysilicon of 1:1. This results in the formation of narrow vertical insulating regions under the polysilicon spacers formed from the fifth polysilicon layer. The polysilicon spacers are removed along with portions of the fourth polysilicon layer to the first $Si_3N_4$ layer. The double-crown portions of the capacitors bottom electrodes are now formed by depositing a conformal sixth polysilicon layer and anisotropically blanket etching back to form the polysilicon double-crown sidewall spacers on the narrow vertical insulating regions. The narrow vertical insulating regions, composed for example, of $SiO_2$, are now selectively etched with respect to the exposed polysilicon and $Si_3N_4$ areas. This completes the array of bottom electrodes for the double-crown capacitors. The array of capacitors for the DRAM cells is now completed using a more conventional method of depositing a thin interelectrode dielectric layer having a high dielectric constant, and by depositing a conducting layer such as a heavily doped polysilicon. The additional surface area for the double-crown shaped capacitors over traditional stacked capacitors increases the capacitance by a factor of three.

BRIEF DESCRIPTION OF THE DRAWINGS

The objects and advantages of this invention are best understood with reference to the attached drawings in the Figs. and the detailed embodiment that follows.

DESCRIPTION OF THE PREFERRED EMBODIMENT

Proceeding now in detail with the process of this invention, the method for forming DRAM cells having these improved double-crown shaped capacitors is described with reference to FIGS. 1 through 15. DRAM cells are usually formed on P-doped semiconductor substrates using N-channel field effect transistor (N-FET) structures as the pass transistors in each of the DRAM cells. It should also be well understood by one skilled in the art that by including additional process steps, in addition to those described in this embodiment, other types of devices can also be included on the DRAM chip. As one example, N-Well regions can be formed in the P-doped substrate, P-channel FETs can also be provided from which Complementary Metal-Oxide-Semiconductor (CMOS) circuits can also be formed, such as are used for the peripheral circuits on the DRAM chip.

Figure 1:
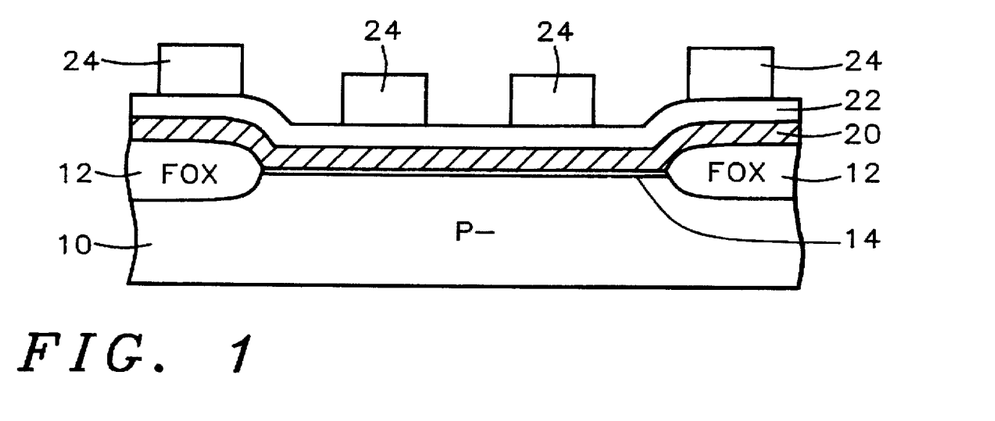
FIGS. 1 through 15 show schematic cross-sectional views for a portion of the array of DRAM cells depicting the series of process steps for the DRAM cells having the double-crown shaped storage capacitor by the method of this invention. The cross sections show the formation of two of the memory cells having double-crown shaped capacitors and a common bit line.

Referring to FIG. 1, a schematic cross-sectional view of a portion of semiconductor substrate 10 is shown having partially completed DRAM cells. The Fig. depicts a portion of the memory cells having two pass transistors (N-FET) formed on and in the active device region on the substrate surface. The preferred substrate is usually composed of a lightly P-type single crystal silicon having preferably a<100> crystallographic orientation. A relatively thick Field OXide (FOX) 12 is formed surrounding and electrically isolating the individual device regions in which the memory cells are built. The field oxide 12, only partially shown in FIG. 1, is commonly formed by the LOCal Oxidation of Silicon (LOCOS) method. Although the individual process steps for forming the FOX are not shown in FIG. 1, the LOCOS method involves depositing a thin $SiO_2$ (pad oxide) and a thicker silicon nitride ($Si_3N_4$) layer as an oxidation barrier layer on the substrate surface, and using conventional photolithographic techniques and etching to remove the barrier layer in areas where a field oxide is desired, while retaining the $Si_3N_4$ in areas where active devices are to be fabricated. The silicon substrate is then subjected to a thermal oxidation to form the field oxide areas 12. The oxide is usually grown to a thickness in the range of between about 3000 and 6000 Angstroms.

The N-channel FETs are now formed in the active device regions after removing the $Si_3N_4$ barrier layer and pad oxide in a wet etch. For example, the nitride can be removed in a hot phosphoric acid ($H_3PO_4$) etch at about 180° C., and a pad oxide can be removed in a dilute solution of hydrofluoric acid and water ($HF/H_2O$). The gate oxide for the N-FETs is formed next in the device areas by thermally oxidizing the active device region to form a thin gate oxide 14, as shown in FIG. 1. Typically, the thickness of the gate oxide 14 is between about 50 and 150 Angstroms.

Referring still to FIG. 1, the FET gate electrodes in the device areas and the interconnecting word lines on the field oxide 12 are formed next by depositing a first polycide layer 20. Typically polycide layer 20 is formed by depositing a polysilicon layer which is heavily doped with N-type impurities using, for example, low pressure chemical vapor deposition (LPCVD) and a reactant gas such as silane. To complete polycide layer 20, a silicide layer such as tungsten silicide ($WSi_2$) is deposited on the polysilicon layer using, for example, CVD and a reactant gas such as tungsten hexafluoride. The polycide layer 20 is depicted in the Figs. as a single layer to simplify the drawings. Typically the thickness of the N-doped polysilicon layer is between about 500 and 1500 Angstroms, and the thickness of the $WSi_2$ layer is between about 500 and 1500 Angstroms. A first insulating layer 22 composed, for example, of silicon oxide ($SiO_2$), is deposited on the polycide layer 20. A patterned photoresist layer 24, also shown in FIG. 1, is then used to mask the first insulating layer 22 and the first polycide layer 20 over the areas where the gate electrodes and the word lines will be formed.

Figure 2:
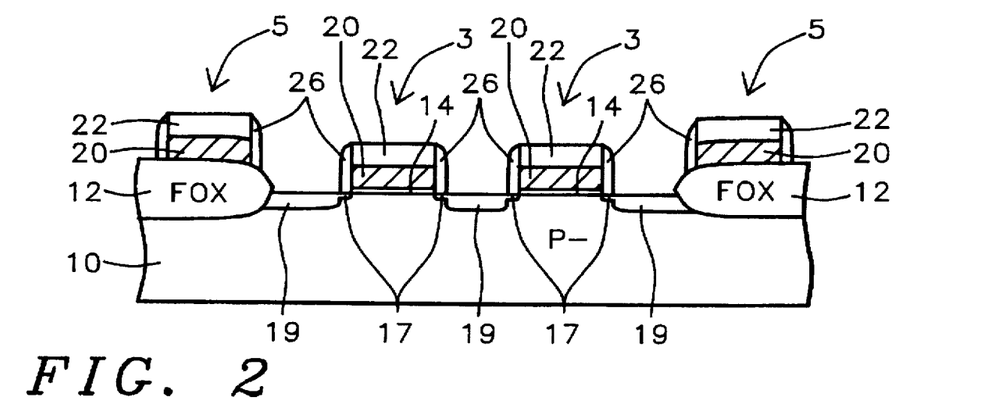

Using the photoresist layer 24, the insulating layer 22 and the polycide layer 20 are patterned using anisotropic plasma etching to form the gate electrodes 3 and word lines 5, as shown in FIG. 2. For example, the first insulating layer 22 composed of $SiO_2$ can be etched in a reactive ion etcher using an etchant gas such as carbon tetrafluoride ($CF_4$), and the polycide layer 20 can be etched also by reactive ion etching (RIE) using a chlorine ($Cl_2$) gas or a chlorine-containing gas such as dichlorodifluoro-methane ($CCl_2F_2$), and a carrier gas such as argon (Ar).

Still referring to FIG. 2, lightly doped drain (LDD) areas 17 are formed adjacent to the gate electrodes 3 by ion implantation. For example, the LDDs can be formed by implanting an $N^+$ dopant such as arsenic ($As^{75}$) ions in the silicon substrate 10. Typically the implant dose is between about 1.0 E 15 and 1.0 E 16 ions/cm² at an implant energy of between about 20 and 40 KeV. Next a conformal second insulating layer 26 is deposited and is anisotropically etched back to the silicon substrate 10 to form insulating sidewall spacers, also labeled 26, adjacent to the gate electrodes formed from polycide layer 20, as shown in FIG. 2. The source/drain contact areas 19 are then formed by heavily doping the device areas adjacent to the sidewall spacers 26 using, for example ion implantation. Alternatively, the heavily doped source/drain regions can be formed later in the process by out-diffusion of $N^+$ dopants from a polysilicon layer. This completes the array of FET pass transistors for the DRAM cells.

Figure 3:
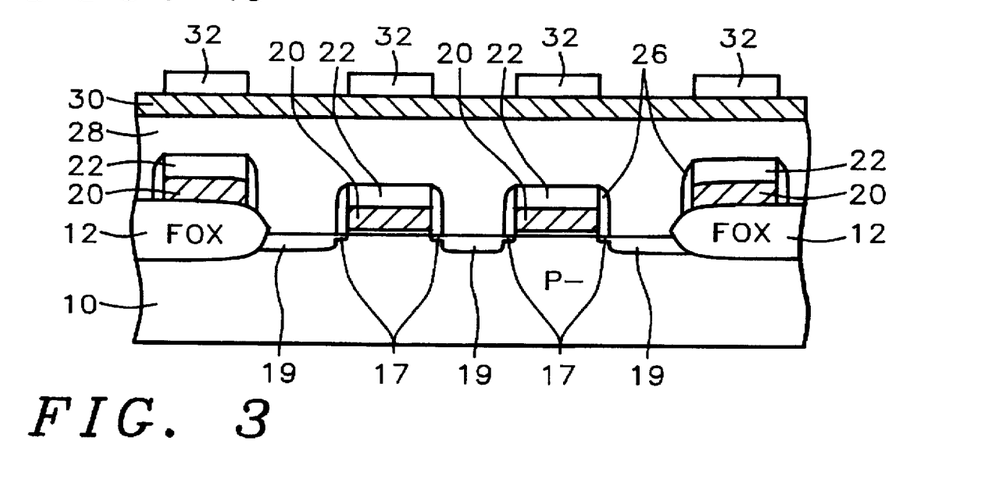

Referring now to FIGS. 3–7, the method for forming the bit lines and concurrently forming the node contacts for the double-crown shaped storage capacitors is described. As shown in FIG. 3, a third insulating layer 28 is deposited and planarized over the array of FETs. Preferably, the insulating layer is composed of a silicon oxide. For example, a low-flow temperature glass doped with boron and phosphorus such as a borophosphosilicate glass (BPSG) can be used and then thermally annealed to provide the leveling. Alternatively, an undoped $SiO_2$ can be used and then chemically/mechanically polished to provide a more global planarization of third insulating layer 28. Preferably layer 28 is deposited using LPCVD using a reactant gas such as tetraethosiloxane (TEOS), either doped or undoped, and is deposited preferably to a thickness of between about 500 and 1500 Angstroms. A first polysilicon layer 30 is now deposited on the planar third insulating layer 28, as shown in FIG. 3. Preferably polysilicon layer 30 is deposited by LPCVD, using for example silane ($SiH_4$) as the reactant gas. Layer 30 can be $N^+$ doped or undoped and preferably is deposited to a thickness of between about 500 and 1500 Angstroms. Conventional photolithographic techniques are used to coat and pattern a photoresist layer 32 providing openings over the device areas where bit line contacts and node contacts for the capacitors are desired.

Figure 4:
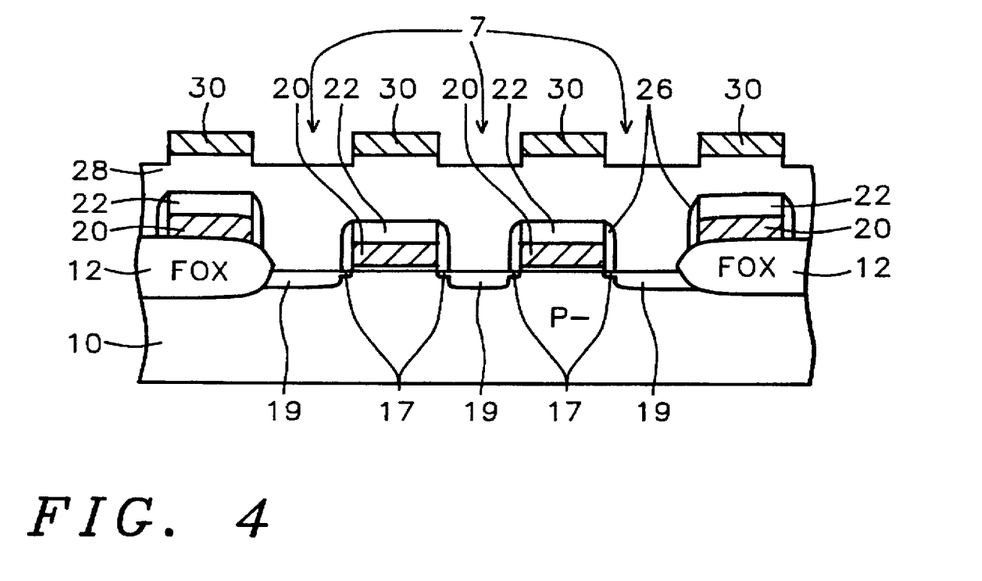

The patterned photoresist layer 32 shown in FIG. 3 is now used as an etch mask to pattern the first polysilicon layer 30 and to partially recess into the third insulating layer 28, forming recesses 7, as shown in FIG. 4, by anisotropic plasma etching. For example, the etching can be carried out using RIE and an etchant gas such as trifluoromethane ($CHF_3$) or carbon tetrafluoride/hydrogen ($CF_4/H_2$). Layer 28 is preferably recessed to a depth of between about 1000 and 2000 Angstroms.

Figure 5:
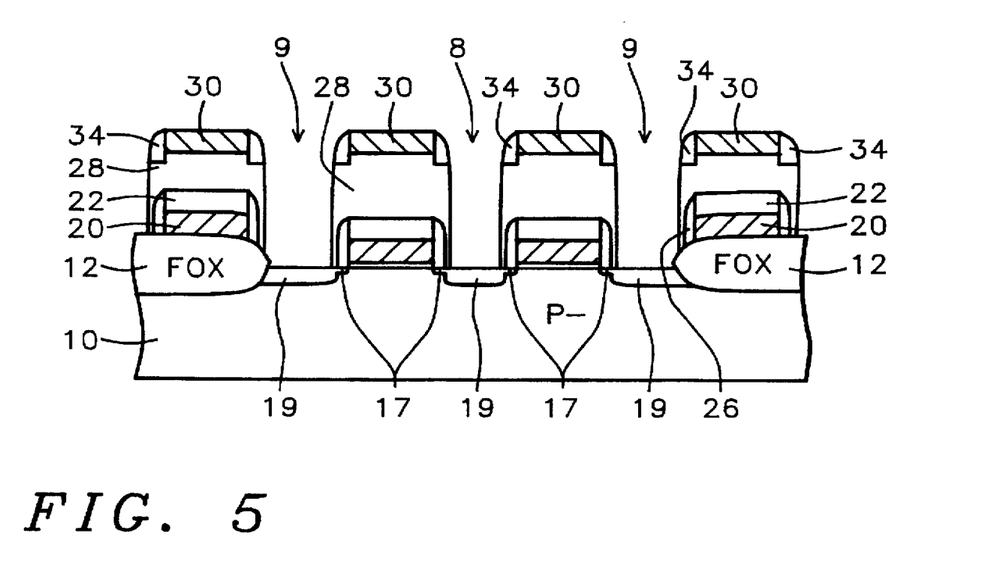

Referring to FIG. 5, a conformal second polysilicon layer 34 is deposited and is anisotropically etched back to form polysilicon spacers also labeled 34 on the sidewalls of the patterned first polysilicon layer 30 and also on the sidewalls of the recesses in insulating layer 28. Preferably layer 34 is deposited by LPCVD using silane and is heavily $N^+$ doped having a concentration of between about 1.0 E 19 and 1.0 E 21 atoms/cm³. The thickness of layer 34 is preferably between about 500 and 1500 Angstroms. The polysilicon layer 30 and sidewall spacers 34 are used as an etch mask to anisotropically etch the third insulating layer 28 to the surface of substrate 10. This forms concurrently the bit line contact openings 8 and the capacitor node contact openings 9, while the sidewall spacers 34 reduce the size of the contact openings thereby providing increased device packing density.

Figure 6:
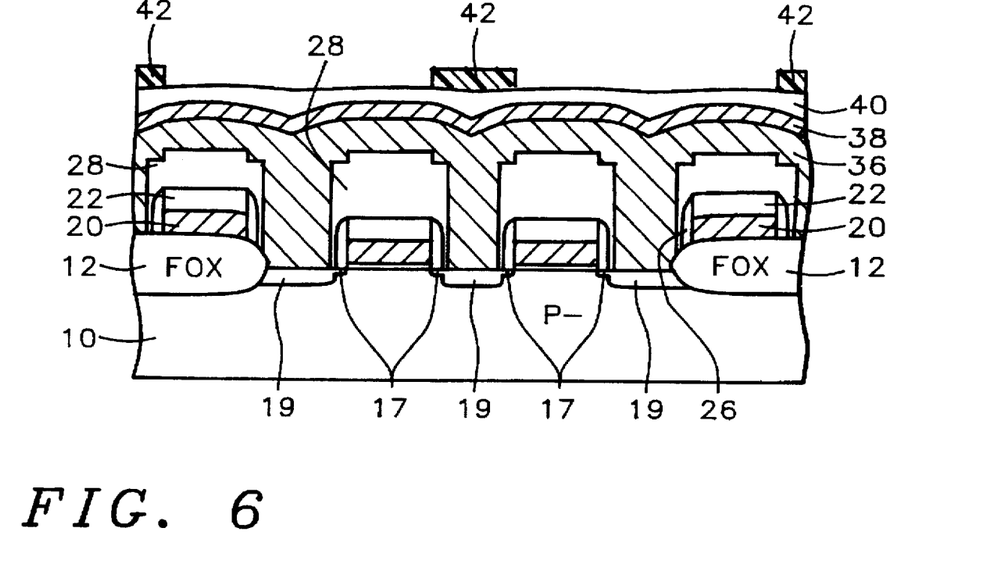

Referring now to FIG. 6, a third polysilicon layer 36 is deposited to completely fill the bit line and node contact openings and is deposited to a thickness sufficient to form essentially a planar surface over the contact openings. Layer 36 is preferably doped $N^+$ having a concentration of between about 1.0 E 19 and 1.0 E 21 atoms/cm³, and is deposited to a thickness of between 1000 and 2500 Angstroms. To improve the electrical conductivity for the bit lines, a second silicide layer 38 is deposited on layer 36. For example, silicide layer 38 can be composed of tungsten silicide ($WSi_2$) having a thickness of between about 500 and 1500 Angstroms. The $WSi_2$ can be deposited by CVD using, for example tungsten hexafluoride ($WF_6$). Next a $Si_3N_4$ layer 40 is deposited on the silicide layer 38. For example, layer 40 can be deposited by LPCVD using a reactant gas such as dichlorosilane ($SiCl_2H_2$) and ammonia ($NH_3$) in a temperature range of between about 700° and 800° C. The preferred thickness of layer 40 is between about 1000 and 2000 Angstroms. A patterned photoresist layer 42 is patterned to define the bit lines and node contacts for the DRAM cells.

Figure 7:
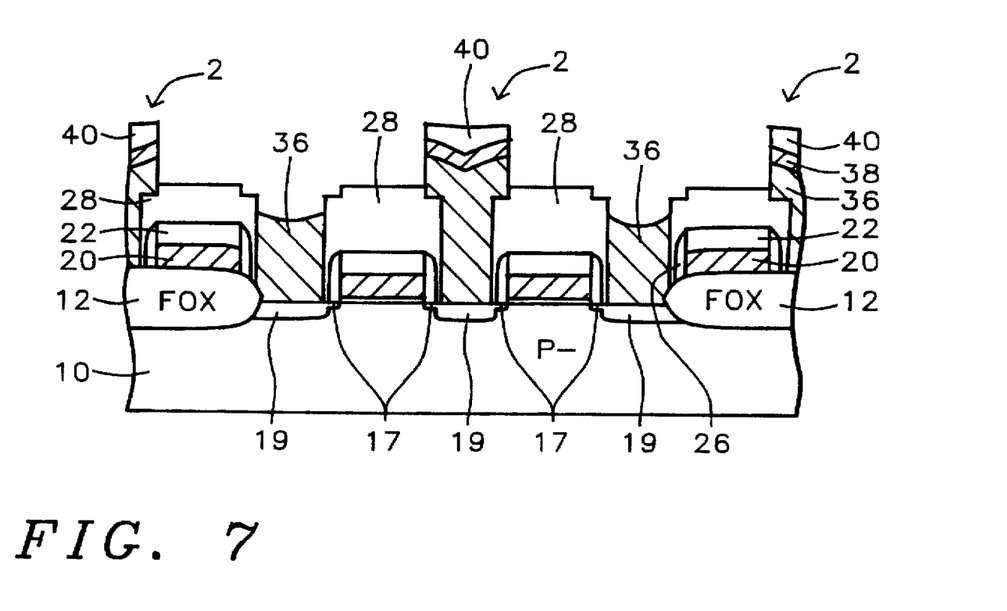

The patterned photoresist layer 42 is now used as an etch mask to etch the multilayer comprising the silicon nitride layer 40, the silicide layer 38, and the third polysilicon layer 36 to form the bit lines. The multilayer is anisotropically etched to the surface of the third insulating layer 28 to form the bit lines 2 as shown in FIG. 7, while leaving portions of layer 36 in the node contact openings 9 to form contacts for the capacitors.

Figure 8:
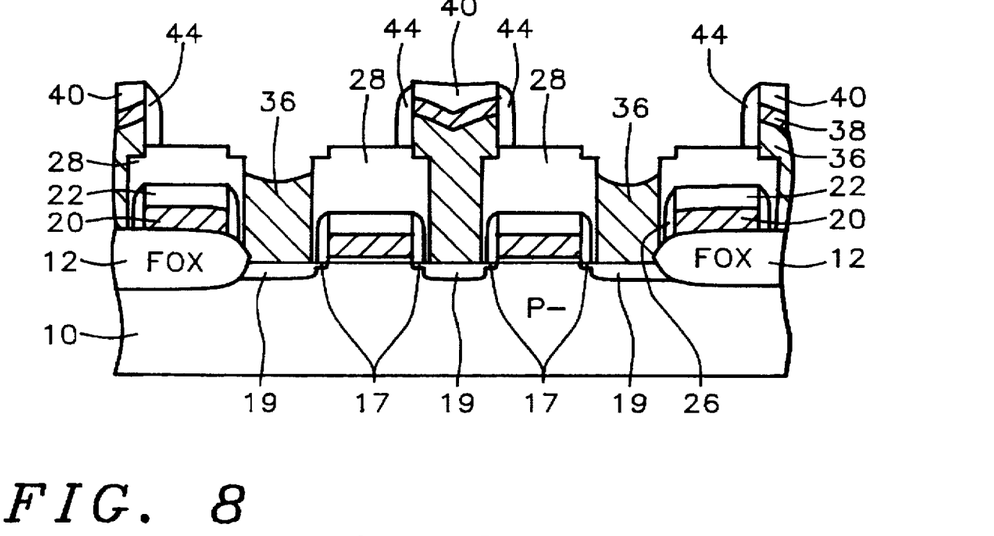

Referring next to FIG. 8, a second silicon nitride layer 44 is deposited and anisotropically etched back to form silicon nitride spacers, also labeled 44, on the sidewalls of the bit lines 2. The $Si_3N_4$ is deposited by a method similar to layer 40. The $Si_3N_4$ layer 40 and sidewall spacers 44 insulate the bit lines 2 from the next level of integration, which is the formation of the double-crown-shaped storage capacitors.

Figure 9:
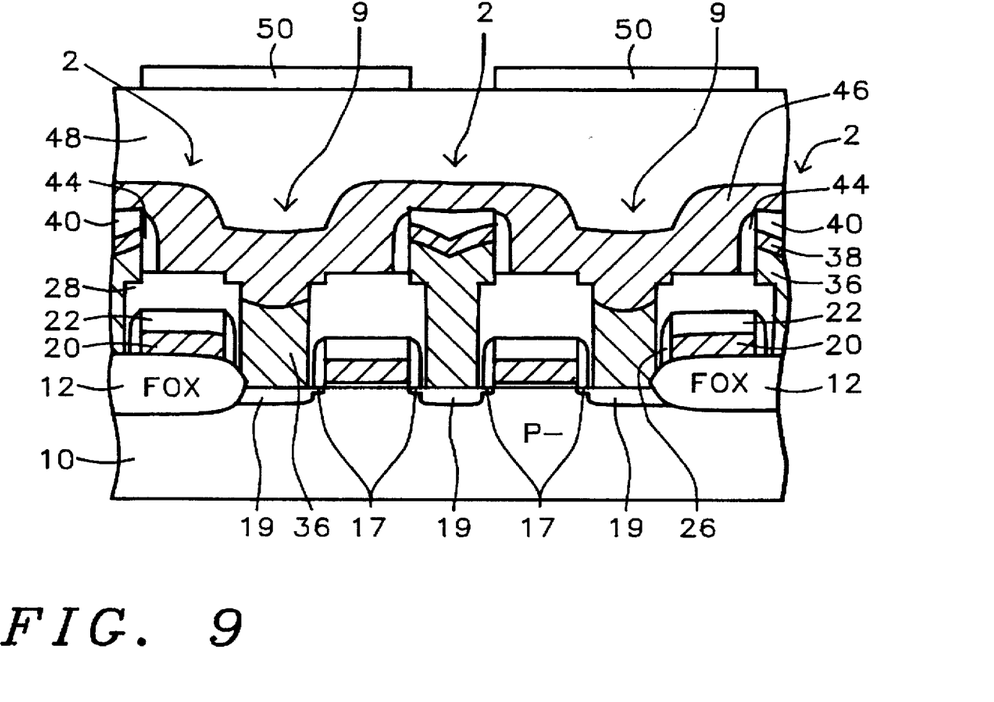

Referring now to FIGS. 9–15, the remainder of this embodiment addresses more specifically the method of fabricating the array of improved double-crown storage capacitors on the DRAM device. In accordance with the objects of this invention, a polysilicon spacer is used as a mask to etch narrow vertical structures from an insulating material on which are formed polysilicon sidewalls. These sidewalls become the vertical double-crown structure for the bottom electrodes of the storage capacitors. As shown in FIG. 9, a conformal fourth polysilicon layer 46 is blanket deposited over the insulated bit lines 2 and also contacting the portions of polysilicon layer 36 in the node contact openings 9. The preferred method for depositing polysilicon layer 46 is similar to the method of depositing polysilicon layer 36 and is also heavily doped $N^+$ to improve the conductivity. Layer 46 is deposited to a thickness of between about 1500 and 2500 Angstroms.

Still referring to FIG. 9, a relatively thick fourth insulating layer 48 is deposited on fourth polysilicon layer 46. Preferably layer 48 is composed of $SiO_2$. For example, layer 48 can be deposited by LPCVD using TEOS. Insulating layer 48 is deposited to a thickness of between about 8000 and 12000 Angstroms, and is planarized using, for example, chemical/mechanical polishing. Alternatively, a low-flow-temperature oxide can be used such as BPSG and made level by a thermal reflow anneal. As shown in FIG. 9, a photoresist mask 50 is formed by conventional photolithographic techniques having portions over the node contact openings 9 and defining the area over which the bottom electrodes will be formed.

Figure 10:
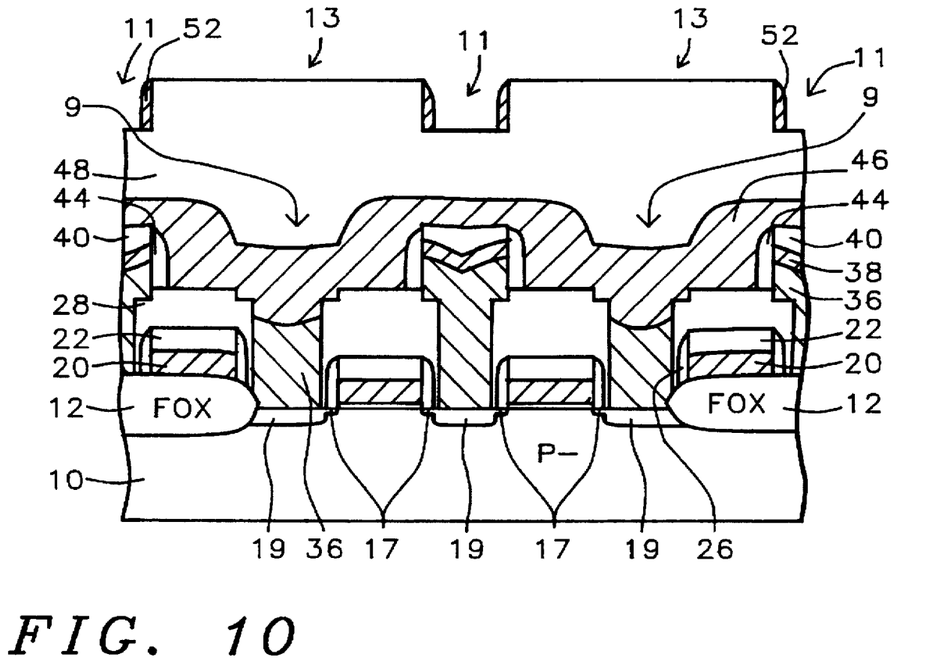

The photoresist mask 50 is now used to pattern insulating layer 48 by partially anisotropically etching, as shown in FIG. 10. Preferably, the anisotropic etching is carried in a reactive ion etcher or other high-plasma density etcher using a fluorine-containing gas such as carbon tetrafluoride ($CF_4$). The photoresist layer is then removed using conventional means leaving unetched portions of layer 48 over the node contacts 9, and forming second recessed areas 11 elsewhere in layer 48. Preferably, the depth of the recesses 11 is between about 2500 and 4000 Angstroms.

Continuing with the process, a conformal fifth polysilicon layer 52 is deposited over the patterned fourth insulating layer 48 having recessed areas 11, and is anisotropically etched back to form polysilicon spacers 52 on the sidewalls in the recessed areas 11, as shown in FIG. 10. Layer 52 is deposited by LPCVD and is preferably undoped. The thickness of layer 52 is chosen to provide sidewall spacers 52, after etch back, which are between about 500 and 1000 Angstroms wide.

Figure 11:
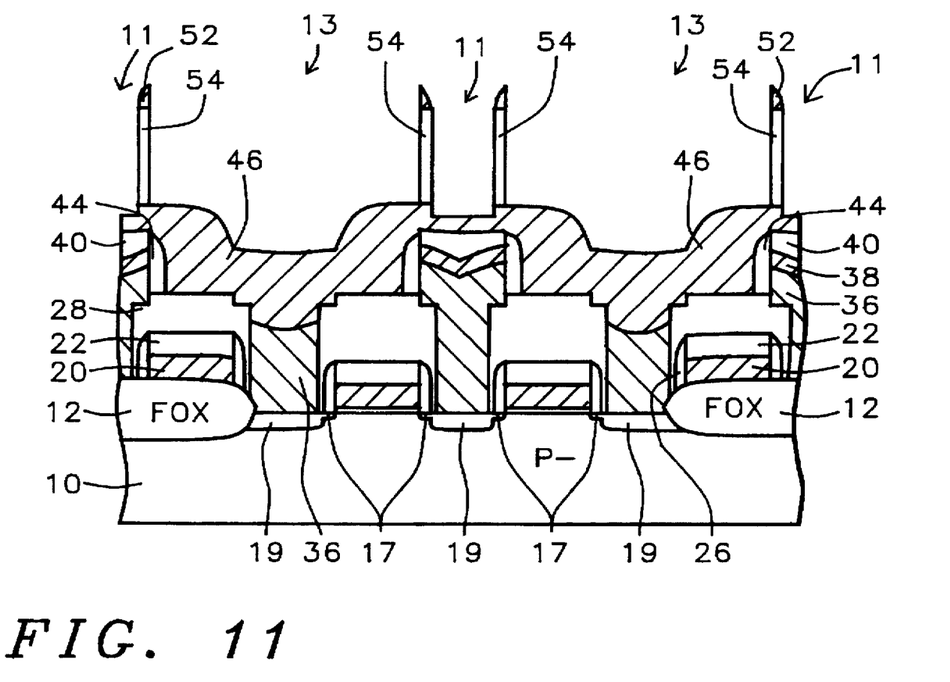

Now as shown in FIG. 11, the fourth insulating layer 48 is anisotropically plasma etched to the surface of the fourth polysilicon layer 46 over the nonrecessed areas 13 (as shown in FIG. 10). The masking effect of the polysilicon sidewall spacers 52 results in the formation of narrow vertical regions 54. Important to this invention the anisotropic plasma etching is carried out using an etch rate selectivity of 1:1 between the polysilicon and fourth insulating layer. For example, if the fourth insulating layer is a silicon oxide, the preferred etching to achieve this 1:1 selectivity can be performed in a reactive ion etcher or high-density plasma etcher at low pressures using an etchant gas mixture such as $CHF_3$ or $CF_4$. During the etching of layer 48 to the surface of layer 46 in the nonrecessed areas 13, the polysilicon layer 46 is substantially overetched in the recessed areas 11. This results in a much thinner polysilicon layer 46 in the recessed areas, as shown in FIG. 11. This is important to this invention because if the depth of the recess is about equal to the thickness of the fourth polysilicon layer 46, layer 46 in the recessed area 11 is essentially removed, using the 1:1 etch-rate ratio. This allows one to form an array of bottom electrodes that are electrically isolated from each other as will become clear in FIG. 12.

Figure 12:
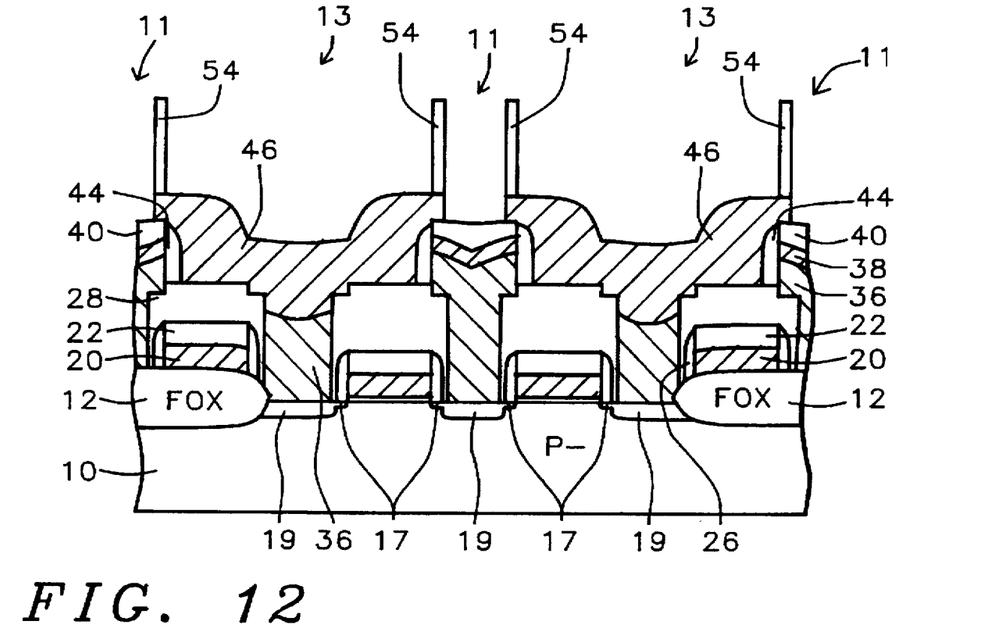

Referring to FIG. 12, the remaining portions of polysilicon spacers 52 (shown in FIG. 11) are removed by plasma etching which also slightly recesses polysilicon layer 46 in the nonrecessed areas 13 and ensures that any remaining polysilicon layer 46 in the recessed areas 11 is completely removed to the first $Si_3N_4$ layer 40. This results in the complete electrical isolation between adjacent bottom electrodes for the DRAM cells formed from the remaining polysilicon layer 46. The preferred plasma etching to remove the spacers 52 is carried out using a high selective etch rate of polysilicon to silicon nitride. For example the etching can be carried out in a reactive ion etcher using an etchant gas mixture of chlorine ($Cl_2$) and hydrogen bromide (HBr).

Figure 13:
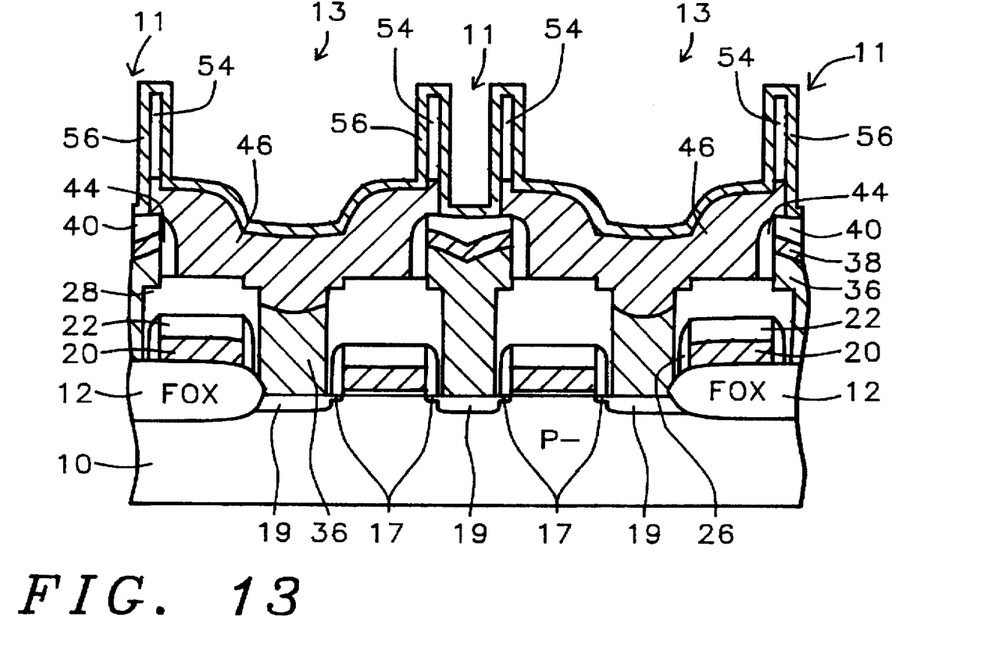

Referring to FIG. 13, the double-crown portions of the bottom electrodes of the capacitors are now formed by first depositing a conformal sixth polysilicon layer 56. The conformal polysilicon layer uniformly coats the narrow vertical insulating structures 54. Preferably sixth polysilicon layer 56 is deposited by LPCVD using, for example, silane ($SiH_4$) as the reactant gas, and is in situ heavily doped $N^+$, for example by adding phosphine ($PH_4$) during the deposition. Preferably the dopant concentration in layer 56 is between about 1.0 E 19 and 1.0 E 21 atoms/cm$^3$. The preferred thickness of layer 56 is between about 500 and 1000 Angstroms, and more specifically having a thickness of 500 Angstroms.

Figure 14:
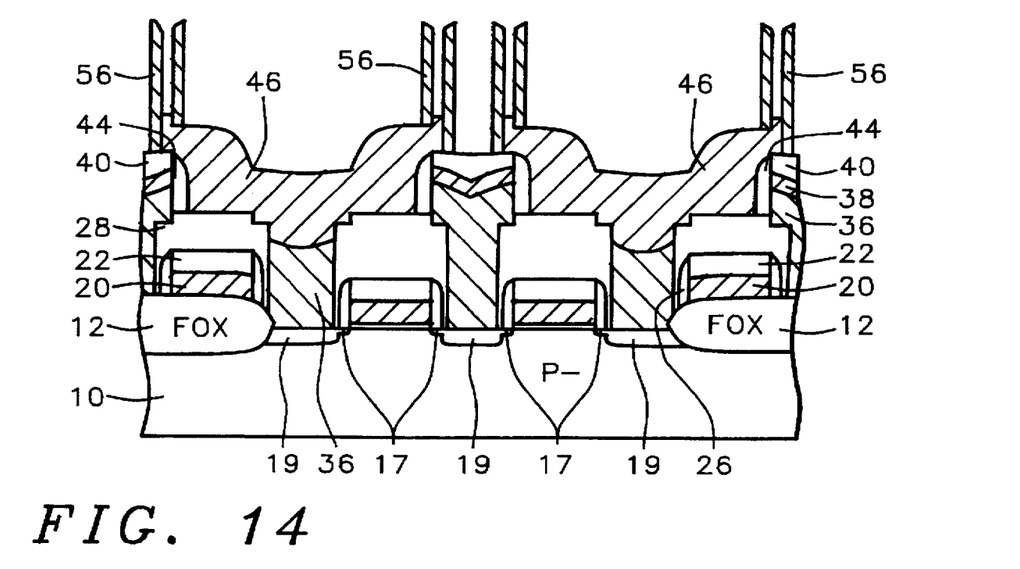

Now as shown in FIG. 14, the sixth polysilicon layer 56 is anisotropically etched back exposing the top of the narrow vertical insulating structures 54 and concurrently removing layer 56 in the recessed areas 11 to the silicon nitride layer 40, thereby ensuring that the array of bottom electrodes remains electrically isolated. Preferably the etching is carried out in a reactive ion etcher, or alternatively in a high plasma density etcher using an etchant gas containing a chlorine species.

The narrow vertical insulating regions 54, composed for example, of $SiO_2$, are now selectively removed to polysilicon layer 46. The preferred etching, for example, can be carried out in a hydrofluoric acid solution ($HF/H_2O$) which leaves essentially unetched the exposed polysilicon layers 54 and 56 and exposed $Si_3N_4$ layer 40. This completes the array of bottom electrodes having double-crown-shaped storage capacitors.

Figure 15:
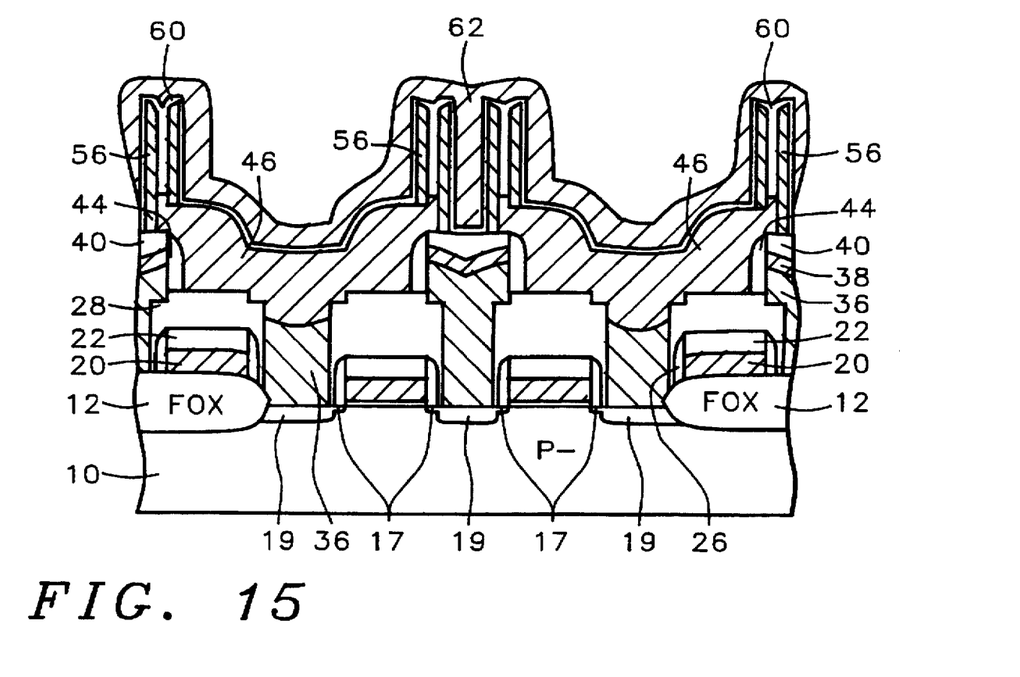

The double-crown storage capacitors for the DRAM cells are now completed, as shown in FIG. 15. The method continues by forming a capacitor interelectrode dielectric layer 60 on the surface of the capacitor bottom electrodes composed of polysilicon layer 46 and the double-crown portions formed from polysilicon layer (spacers) 56. The dielectric layer 60 is preferably composed of silicon nitride and silicon oxide ($Si_3N_4/SiO_2$) or layers of silicon oxide, silicon nitride and silicon oxide (ONO). For example, the dielectric layer 60 composed of silicon nitride and silicon oxide can be formed by depositing a silicon nitride layer using LPCVD and a reactive gas mixture of ammonia ($NH_3$) and dichlorosilane ($SiH_2Cl_2$) followed by oxidation of the silicon nitride layer in a wet oxygen at a temperature of about 850° C. for about 10 minutes. The preferred total thickness of the interelectrode dielectric layer 60 is between about 30 and 100 Angstroms. In addition, other commonly practiced methods can be used to further increase the capacitance, such as roughing the electrode surface and by using interelectrode materials having higher dielectric constants, such as tantalum pentoxide ($Ta_2O_5$).

Also shown in FIG. 15, a seventh polysilicon layer 62 is deposited on the interelectrode dielectric layer 60. Layer 62 conformally covers the bottom electrode having the interelectrode dielectric on the surface, and forms the top electrode for storage capacitors. Layer 62 is preferably deposited by LPCVD and is in situ doped N-type. The preferred thickness of polysilicon layer 62 is between about 1000 and 2000 Angstroms and is doped with an N-type dopant impurity, such as with phosphorus (P). The preferred concentration of phosphorus in layer 62 is in the range of between about 5.0 E 19 to 1.0 E 21 atoms/$cm^3$. The polysilicon layer 62 is then patterned using conventional photolithographic techniques and plasma etching to form the top electrodes and to complete the double-crown shaped array of storage capacitors. Two adjacent capacitors of the array of capacitors are depicted in FIG. 15.

Figure 16:
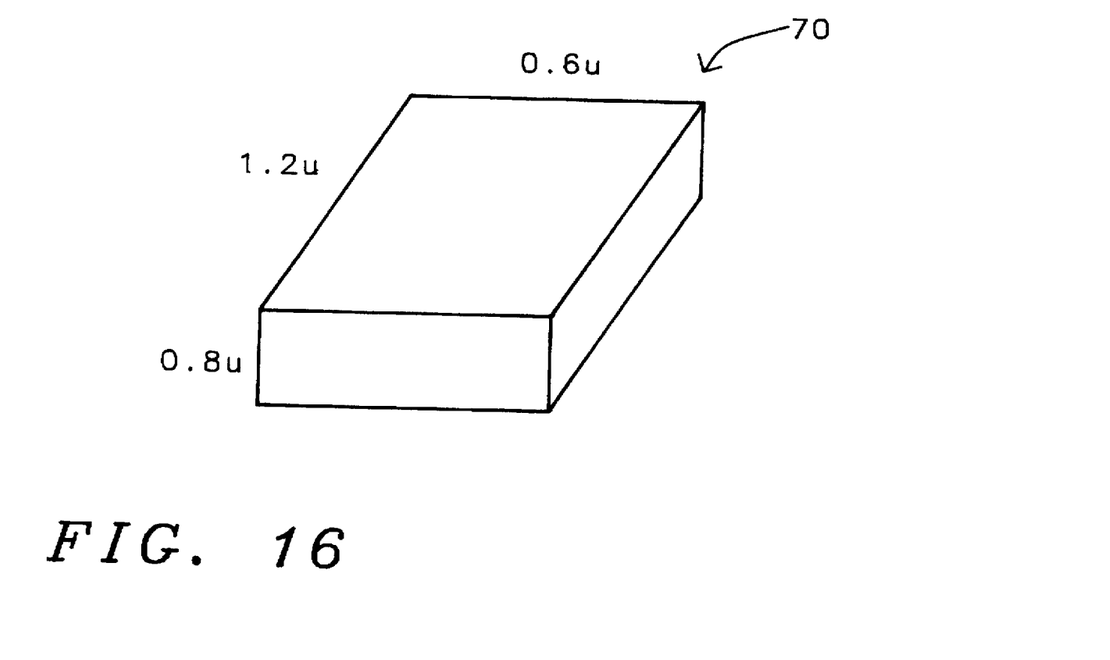
FIG. 16 shows a schematic aerial view of a typical stacked capacitor by the prior art.
Figure 17:
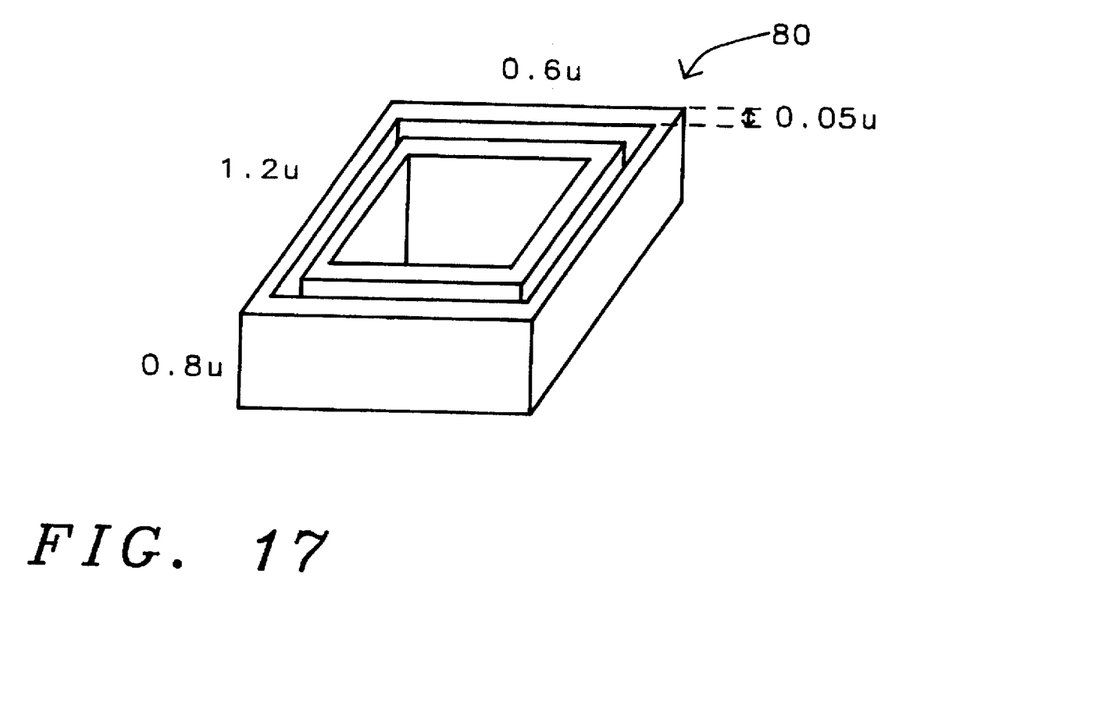
FIG. 17 shows a schematic aerial view of the double-crown shaped capacitor having the same outer dimensions as the capacitor in FIG. 16.

To better appreciate the advantages of this invention, a schematic aerial view is shown of a more conventional stacked capacitor 70 in FIG. 16, and compared with the double-crown-shaped capacitor 80 of the current invention shown in FIG. 17, having comparable outer dimensions. As shown in FIGS. 16–17, the conventional stacked capacitor and the double-crown shaped stacked capacitor are 0.8 um thick and have a respective length and width of 1.2 um and 0.6 um. For the dimensions shown for FIG. 16, the total surface area is 3.6 $um^2$. The double-crown-shaped capacitor having crown regions that are 0.05 um wide and having a 0.05 um separation, as shown in FIG. 17, has a calculated surface area of 9.9 $um^2$, and therefore increases the surface area by a multiple of 2.75 over the conventional stacked capacitor.

While the invention has been particularly shown and described with reference to the preferred embodiments thereof, it will be understood by those skilled in the art that various changes in form and details may be made without departing from the spirit and scope of the invention.

What is claimed is:

1. A method for fabricating an array of double-crown storage capacitors on a semiconductor substrate, comprising the steps of:

providing a semiconductor substrate having device areas surrounded and electrically isolated from each other by field oxide areas and further providing field effect transistors having gate electrodes formed from a patterned first polycide layer and a first insulating layer and having sidewall spacers formed from a second insulating layer and having source/drain areas adjacent to said gate electrodes in said device areas;

depositing a third insulating layer having a planar surface;

depositing a first polysilicon layer on said third insulating layer;

patterning said first polysilicon layer by anisotropic plasma etching and partially etching into said third insulating layer over said device areas adjacent to said gate electrodes forming first recessed areas;

depositing a conformal second polysilicon layer and anisotropically etching back thereby forming polysilicon spacers on the sidewalls of said first recessed areas;

anisotropically etching said third insulating layer in said first recessed areas thereby forming concurrently bit line contact openings and capacitor node contact openings;

depositing a third polysilicon layer thereby filling said contact openings;

depositing a silicide layer on said third polysilicon layer;

depositing a silicon nitride layer on said silicide layer;

patterning said silicon nitride layer, said silicide layer, and said third polysilicon layer thereby forming bit lines and concurrently forming node contacts for said capacitors;

depositing a conformal second silicon nitride layer and anisotropically etching back to form silicon nitride spacers on said bit lines;

depositing a fourth polysilicon layer on said substrate;

depositing a fourth insulating layer on said fourth polysilicon layer and planarizing said fourth insulating layer;

patterning said fourth insulating layer by photoresist masking and anisotropically etching partially into said fourth insulating layer leaving unetched portions over said node contacts forming second recessed areas elsewhere on said substrate;

depositing a conformal fifth polysilicon layer and anisotropically etching back to form polysilicon spacers on the sidewalls of said second recessed areas;

anisotropically etching said fourth insulating layer to said fourth polysilicon layer using said polysilicon spacers as an etch mask thereby forming narrow vertical insulating regions under said polysilicon spacers;

removing said polysilicon spacers and also removing said fourth polysilicon layer to said first silicon nitride layer;

depositing a conformal sixth polysilicon layer;

anisotropically blanket etching said sixth polysilicon layer thereby forming polysilicon double-crown sidewall spacers on said narrow vertical insulating regions;

selectively etching said narrow vertical insulating regions thereby forming an array of bottom electrodes for said double-crown capacitors;

depositing a thin interelectrode dielectric layer on said bottom electrodes;

depositing a conducting layer on said dielectric layer thereby completing said double-crown capacitors.

2. The method of claim 1, wherein said third insulating layer is silicon oxide having a thickness of between about 500 and 1500 Angstroms.

3. The method of claim 1, wherein said first polysilicon layer is undoped and has a thickness of between about 500 and 1500 Angstroms.

4. The method of claim 1, wherein said third polysilicon layer has a thickness of between about 500 and 1500 Angstroms and is heavily doped with an N-type conductive impurity.

5. The method of claim 1, wherein said fourth polysilicon layer has a thickness of between about 1500 and 2500 Angstroms and is heavily doped with an N-type conductive impurity.

6. The method of claim 1, wherein said fourth insulating layer is silicon oxide having a thickness of between about 8000 and 12000 Angstroms.

7. The method of claim 1, wherein said second recessed areas are etched to a depth of between about 2500 and 4000 Angstroms.

8. The method of claim 1, wherein said sixth polysilicon layer is deposited to a thickness of between about 500 and 1000 Angstroms and is heavily doped with an N- type conductive impurity.

9. The method of claim 1, wherein said anisotropic etching of said fourth insulating layer to said fourth polysilicon layer is carried out with an etch rate ratio of silicon oxide to polysilicon of 1:1.

10. The method of claim 1, wherein said double-crown storage capacitor has a surface area which is three times greater than the more conventional solid stacked capacitor having similar outer dimensions.

11. A method for fabricating an array of dynamic random access memory cells having double-crown storage capacitors on a semiconductor substrate, comprising the steps of:

providing a semiconductor substrate having device areas surrounded and electrically isolated from each other by field oxide areas;

depositing a first polycide layer on said device areas and elsewhere on said substrate;

depositing a first insulating layer on said first polycide layer;

patterning said first insulating layer on said first polycide layer and forming gate electrodes for field effect transistors on said device areas and word lines on said field oxide areas;

ion implanting and thereby forming lightly doped drain areas adjacent to said gate electrodes in said device areas;

depositing a conformal second insulating layer and anisotropically etching back to form sidewall spacers on said gate electrodes;

ion implanting and thereby forming source/drain areas for said field effect transistors;

depositing a third insulating layer having a planar surface;

depositing a first polysilicon layer on said third insulating layer;

patterning said first polysilicon layer by anisotropic plasma etching and partially etching into said third insulating layer over said device areas adjacent to said gate electrodes forming first recessed areas;

depositing a conformal second polysilicon layer and anisotropically etching back thereby forming polysilicon spacers on the sidewalls of said first recessed areas;

anisotropically etching said third insulating layer in said first recessed areas thereby forming concurrently bit line contact openings and capacitor node contact openings;

depositing a third polysilicon layer thereby filling said contact openings;

depositing a silicide layer on said third polysilicon layer;

depositing a silicon nitride layer on said silicide layer;

patterning said silicon nitride layer, said silicide layer, and said third polysilicon layer thereby forming bit lines and concurrently forming node contacts for said capacitors;

depositing a conformal second silicon nitride layer and anisotropically etching back to form silicon nitride spacers on said bit lines;

depositing a fourth polysilicon layer on said substrate;

depositing a fourth insulating layer on said fourth polysilicon layer and planarizing said fourth insulating layer;

patterning said fourth insulating layer by photoresist masking and anisotropically etching partially into said fourth insulating layer leaving unetched portions over said node contacts forming second recessed areas elsewhere on said substrate;

depositing a conformal fifth polysilicon layer and anisotropically etching back to form polysilicon spacers on the sidewalls of said second recessed areas;

anisotropically etching said fourth insulating layer to said fourth polysilicon layer using said polysilicon spacers as an etch mask thereby forming narrow vertical insulating regions under said polysilicon spacers;

removing said polysilicon spacers and also removing said fourth polysilicon layer to said first silicon nitride layer;

depositing a conformal sixth polysilicon layer;

anisotropically blanket etching said sixth polysilicon layer thereby forming polysilicon double-crown sidewall spacers on said narrow vertical insulating regions;

selectively etching said narrow vertical insulating regions thereby forming an array of bottom electrodes for said double-crown capacitors;

depositing a thin interelectrode dielectric layer on said bottom electrodes;

depositing a conducting layer on said dielectric layer thereby completing said array of dynamic random access memory cells having said double-crown capacitors.

12. The method of claim 11, wherein said third insulating layer is silicon oxide having a thickness of between about 500 and 1500 Angstroms.

13. The method of claim 11, wherein said first polysilicon layer is undoped and has a thickness of between about 500 and 1500 Angstroms.

14. The method of claim 11, wherein said third polysilicon layer has a thickness of between about 500 and 1500 Angstroms and is heavily doped with an N-type conductive impurity.

15. The method of claim 11, wherein said fourth polysilicon layer has a thickness of between about 1500 and 2500 Angstroms and is heavily doped with an N-type conductive impurity.

16. The method of claim 11, wherein said fourth insulating layer is silicon oxide having a thickness of between about 8000 and 12000 Angstroms.

17. The method of claim 11, wherein said second recessed areas are etched to a depth of between about 2500 and 4000 Angstroms.

18. The method of claim 11, wherein said sixth polysilicon layer is deposited to a thickness of between about 500 and 1500 Angstroms and is heavily doped with an N- type conductive impurity.

19. The method of claim 11, wherein said anisotropic etching of said fourth insulating layer to said fourth polysilicon layer is carried out with an etch rate ratio of silicon oxide to polysilicon of 1:1.

20. The method of claim 11, wherein said double-crown storage capacitor has a surface area which is three times greater than the more conventional solid stacked capacitor having similar outer dimensions.

* * * * *